United States Patent [19]

Homma

[11] Patent Number: 5,399,529
[45] Date of Patent: Mar. 21, 1995

[54] PROCESS FOR PRODUCING SEMICONDUCTOR DEVICES

[75] Inventor: Tetsuya Homma, Tokyo, Japan

[73] Assignee: NEC Corporation, Tokyo, Japan

[21] Appl. No.: 67,094

[22] Filed: May 26, 1993

[30] Foreign Application Priority Data

May 27, 1992 [JP] Japan .................. 4-134556

[51] Int. Cl.6 ............................. H01L 21/44
[52] U.S. Cl. .................................... 437/195
[58] Field of Search ............... 437/235, 230, 238, 195

[56] References Cited

U.S. PATENT DOCUMENTS

| | | | |
|---|---|---|---|
| 4,728,528 | 3/1988 | Ishihara | 427/39 |
| 4,894,332 | 1/1990 | Lane | 437/238 |
| 5,215,787 | 6/1993 | Homma | 427/248.1 |

FOREIGN PATENT DOCUMENTS 57-100748 6/1982 Japan .

OTHER PUBLICATIONS

Homma, Yamaguchi, Murao, "Room–Temperature Chemical vapor deposition silicon oxide fluoride film formation technology for the interlayer in submicron multilevel interconnections" J. Electrochem. Soc., 140(3) 1993 pp. 687–692.

Vines & Gupta, "Interlevel Dielectric Planarization with Spin-on Glass–Films" IEEE, Jun. 9, 1986 pp. 506–515.

Chen, Chao, Lin, Tsai & Tseng "Spin-on Glasses: Characterization and Application," Jun. 1988 IEEE, pp. 306–312.

*Primary Examiner*—R. Bruce Breneman
*Assistant Examiner*—Joni Y. Chang
*Attorney, Agent, or Firm*—Popham Haik Schnobrich & Kaufman, Ltd.

[57] ABSTRACT

Disclosed is a process for producing semiconductor devices of multilevel interconnection structure which are absolutely free from cracking in the insulator films and voids or disconnections in the aluminum wirings. After a fluorine-containing silicon oxide film 4 is formed at a temperature of 50° C. or less using an alkoxyfluorosilane vapor and a water vapor, a spin-on glass film 5 is formed thereon by baking at a temperature of 200° C. or less, which is exposed to the alkoxyfluorosilane vapor to effect condensation of the spin-on glass film at room temperature, and then an insulator film is formed thereon, using the thus treated spin-on glass film as a flattening material.

3 Claims, 1 Drawing Sheet

PROCESS FOR PRODUCING SEMICONDUCTOR DEVICES

BACKGROUND OF THE INVENTION

This invention relates to a process for producing a semiconductor device, more particularly to a process for forming a multilevel interconnection.

A process for forming a multilevel interconnection in the conventional process for forming a semiconductor device will be described referring to FIG. 1.

A first Al wiring 3A is first formed on the semiconductor substrate 1A, and then a first insulator film (CVD-SiO$_2$ film) 14, a spin-on glass (SOG) film 5A and a second insulator film 16 are formed successively to form as a whole a three-layered structure insulator film. Subsequently, after via holes are formed at predetermined positions, a second Al wiring 8A is formed. Thus, a semiconductor device having a double level Al interconnection structure is completed. Such process is disclosed, for example, in Japanese Unexamined Patent Publication No. 100748/1982.

However, the conventional process for forming multilevel interconnection described above involves the following problems.

First, in the formation of the oxide film by chemical vapor deposition, a high film-forming temperature of 300° C. or more is needed, so that cracking is liable to occur in the film thus formed due to thermal stress. Meanwhile, voids are liable to be formed in the Al wirings by the stress and thus the interconnections are easily disconnected when charged. Further, since a heat treatment at 300° C. or more is required when the SOG film is formed, the insulator films are liable to be cracked due to the tensile stress caused by the volume shrinkage of the SOG film and voids are liable to be formed in the Al wirings due to the thermal stress increasing during the heat treatment and the like. Accordingly, not only the yield of the semiconductor devices but also reliability thereof are degraded, disadvantageously.

SUMMARY OF THE INVENTION

With a view to overcoming the above problems, the present invention is directed to provide a process for producing semiconductor devices having high yield and high reliability.

To describe in detail, the process for producing a semiconductor device according to this invention includes a step of forming a lower level wiring on the surface of a semiconductor substrate with an insulator film interposed therebetween; a step of forming a first insulator film on the lower level wiring using an alkoxyfluorosilane vapor and a water vapor at a temperature of 50° C. or less; a step of forming a spin-on glass film by applying a coating solution containing at least one of the compounds represented by the formula Si(OH)$_4$, Si(OR)$_4$ and R$_n$Si(OR)$_{4-n}$ (wherein R represents an alkyl group; and n is an integer of 1 to 3), followed by heat treatment at a temperature of 200° C. or less; a step of exposing the spin-on glass film to a vapor primarily containing a fluorine compound such as alkoxyfluorosilanes in a reaction chamber; a step of forming a second insulator film on the spin-on glass film using an alkoxyfluorosilane vapor and a water vapor; a step of forming via holes at predetermined positions through these insulator films; and a step of forming an upper level wiring which is connected to the lower level wiring through the via holes.

It should be noted that when an alkoxyfluorosilane is hydrolyzed with a water vapor, it readily undergoes a condensation reaction at a temperature of 50° C. or less to form a fluorine-containing silicon oxide film. Further, when a spin-on glass film baked at a low temperature of 100° C. is exposed to the alkoxyfluorosilane vapor, the condensation reaction is accelerated even at room temperature. Accordingly, the heat treatment at a high temperature of 300° C. or more which has been needed in the conventional process becomes unnecessary, and almost no volume shrinkage occurs for spin-on glass films.

Therefore, formation and planarization of the insulator films can be achieved at a temperature of 200° C. or less, particularly even at room temperature, and thus cracking in the insulator films or formation of voids in the Al wirings attributed to the thermal stress applied and volume shrinkage when the insulator films are formed can be prevented from occurring.

BRIEF DESCRIPTION OF THE DRAWINGS

The features of this invention that are believed to be novel are set forth with particularity in the appended claims. The invention, together with the objects and advantages thereof, may best be understood by reference to the following description of a preferred embodiment taken in conjunction with the accompanying drawings in which:

DESCRIPTION OF PREFERRED EMBODIMENT

In the preferred embodiment, triethoxyfluorosilane {FSi(OC$_2$H$_5$)$_3$} and an alcoholic solution of silanol {Si(OH)$_4$} (concentration of solid content: 10 wt %) were used as the alkoxyfluorosilane and the SOG film forming coating liquid, respectively.

Figure 1:
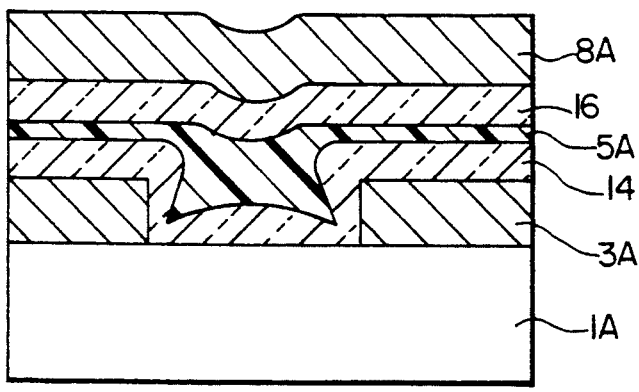
FIG. 1 shows in cross section a part of semiconductor chip formed according to a prior art technique.
Figure 2A:
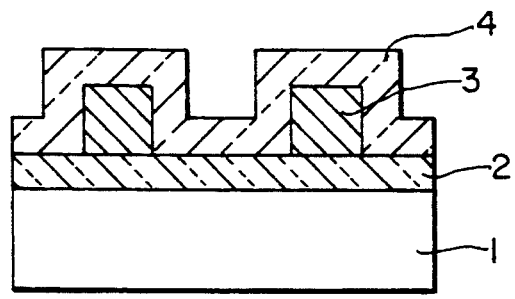
FIGS. 2 (a) to (c) show in cross section a process for forming a semiconductor chip according to one embodiment of the invention.
Figure 2B:
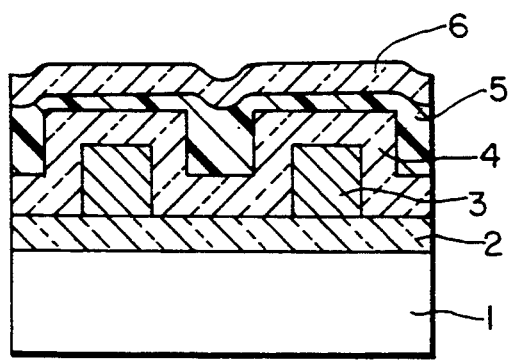
Figure 2C:
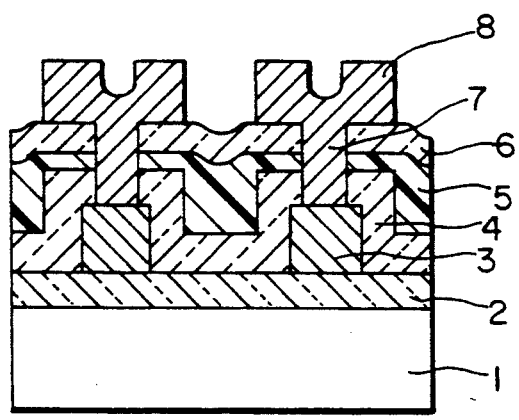

As shown in FIG. 2 (a), a first Al wiring 3 having a thickness of about 1 μm was first formed on a semiconductor substrate 1 such as of Si with an insulator film 2 such as of BPSG and PSG interposed therebetween. Next, a triethoxyfluorosilane solution and a pure water were independently subjected to bubbling to generate vapors, which were introduced to a reaction chamber at a flow rate of 1 SLM, respectively. The resulting semiconductor substrate 1 was maintained at 25° C. under 700 Torr in this reaction chamber for one hour to form a first fluorine-containing silicon oxide film 4 having a thickness of about 0.5 μm.

Subsequently, as shown in FIG. 2 (b), an alcoholic solution of silanol was dropped on the thus treated substrate to carry out spin coating at a rate of 4000 rpm for 20 seconds, and the resulting substrate was subjected to heat treatment on a hot plate at 100° C. in a nitrogen gas atmosphere for 60 seconds to form an SOG film 5 having a thickness of about 0.3 μm. Only the triethoxyfluorosilane vapor was fed to the same reaction chamber as used for forming the first fluorine-containing silicon oxide film 4, and the SOG film 5 was exposed to the triethoxyfluorosilane vapor therein for 30 minutes, followed by formation of a second fluorine-containing silicon oxide film 6 having a thickness of about 0.5 μm in the same reaction chamber under the same conditions as in the formation of the first fluorine-containing silicon oxide film by feeding the triethoxyfluorosilane vapor and a water vapor.

Via holes 7 were then formed at predetermined positions through the thus formed insulator films, as shown in FIG. 2 (c), according to the known photoetching technique, and finally a second Al wiring 8 having a thickness of about 1 μm was formed according to the known sputtering and photoetching methods.

As described above, since the interlayer silicon oxide films can be formed at a low temperature with reduced stress according to this embodiment, the first Al wiring was absolutely free from void and disconnection. In addition, since the insulator films are planarized by the SOG film, no disconnection occurred in the second Al wiring.

When the double level Al interconnection structure was further subjected to heat treatment at a temperature of 450° C. in a nitrogen gas atmosphere for 30 minutes, neither cracking in the insulator films nor formation of voids or disconnection in the Al interconnection occurred.

While triethoxyfluorosilane was used as the alkoxyfluorosilane in the preferred embodiment, other materials, for example, ethoxytrifluorosilane, diethoxydifluorosilane, methoxytrifluorosilane, dimethoxydifluorosilane, trimethoxyfluorosilane, butoxytrifluorosilane, dibutoxydifluorosilane and tributoxyfluorosilane can also be used.

The SOG film-forming coating solution may not be limited to the silanol solution as used in the above embodiment, and a solution containing a tetraalkoxysilane, alkylalkoxysilane or a solution containing at least one of these silane compounds may be used.

While aluminum was used as the wiring layer material in the above embodiment, other materials such as aluminum alloy, tungsten, molybdenum, titanium-containing tungsten, polysilicon, gold, platinum and titanium nitride films or their multi-layered films may also be used.

As described heretofore, since formation of the three-layered insulator film and its planarization can be carried out at a low temperature of 200° C. or less according to the invention, cracking in the insulator film and formation of void or disconnection in the wiring layers can be prevented from occurring. Accordingly, the process of the invention has an effect of improving reliability and yield of semiconductor devices having multilevel interconnection structures.

Although one embodiment of the present invention has been described herein, it should be apparent to those skilled in the art that the present invention may be embodied in many other specific forms without departing from the spirit or scope of the invention.

What is claimed is:

1. A process for producing a semiconductor device comprising the steps of:
   a step for forming a lower level wiring on a semiconductor substrate with an insulator film interposed therebetween;
   a step of forming a first insulator film primarily containing silicon oxide on the entire surface of said substrate including said lower level wiring;
   a step of forming a spin-on glass film by applying a coating solution of a silicon-containing compound to said first silicon oxide film, and heating the thus formed coating film, followed by exposure of the surface of said spin-on glass film to a vapor of fluorine-containing compound;
   a step of forming a second insulator film primarily containing silicon oxide on said spin-on glass film;
   a step of forming via holes at predetermined positions through said second insulator film, spin-on glass film and first insulator film; and
   a step of forming an upper level wiring connected to said lower level wiring through said via holes,
   wherein said vapor of fluorine-containing compound primarily contains an alkoxyfluorosylane.

2. The process for producing a semiconductor device according to claim 1, wherein said first and second insulator films are fluorine-containing silicon oxide films formed using a vapor of alkoxyfluorosilane and a water vapor at a temperature of 50° C. or less.

3. The process for producing a semiconductor device according to claim 1, wherein the heat treatment for forming said spin-on glass film is carried out at a temperature of 200° C. or less in an oxygen gas or inert gas atmosphere.

* * * * *